(12) United States Patent
Mun

(10) Patent No.: US 10,796,864 B2
(45) Date of Patent: Oct. 6, 2020

(54) STRUCTURE OF A FOB KEY FOR INCREASING THE OPERATING FORCE OF A BUTTON

(71) Applicant: Continental Automotive GmbH, Hannover (DE)

(72) Inventor: JaeHo Mun, Gyeonggi-do (KR)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 16/429,559

(22) Filed: Jun. 3, 2019

(65) Prior Publication Data

US 2020/0013568 A1 Jan. 9, 2020

(30) Foreign Application Priority Data

Jul. 3, 2018 (KR) ........................ 10-2018-0076926

(51) Int. Cl.
| | |
|---|---|
| *H01H 13/84* | (2006.01) |
| *B60R 25/24* | (2013.01) |
| *G05G 1/02* | (2006.01) |
| *G05G 5/05* | (2006.01) |
| *H01H 13/705* | (2006.01) |
| *H05K 1/18* | (2006.01) |
| *H05K 5/00* | (2006.01) |

(52) U.S. Cl.
CPC ............. *H01H 13/84* (2013.01); *B60R 25/24* (2013.01); *G05G 1/02* (2013.01); *G05G 5/05* (2013.01); *H01H 13/705* (2013.01); *H05K 1/181* (2013.01); *H05K 5/0086* (2013.01); *B60R 2325/20* (2013.01); *G05G 2505/00* (2013.01); *H01H 2223/04* (2013.01); *H01H 2231/026* (2013.01); *H01H 2231/032* (2013.01); *H05K 2201/10053* (2013.01); *H05K 2201/10446* (2013.01); *H05K 2201/10522* (2013.01)

(58) Field of Classification Search
CPC ...... H01H 13/84; H01H 13/705; H05K 1/181; G05G 1/02
See application file for complete search history.

(56) References Cited

U.S. PATENT DOCUMENTS

| | | | | |
|---|---|---|---|---|
| 5,283,401 A * | 2/1994 | Schmucker | .......... | H01H 25/041 200/6 A |
| 6,462,291 B1 * | 10/2002 | Sachs | ................. | G07C 9/00944 200/302.2 |
| 8,406,000 B2 * | 3/2013 | Zaitz | ................. | G07C 9/00944 361/752 |
| 8,575,503 B2 * | 11/2013 | Krebs | .................... | H01H 13/06 200/293 |
| 9,347,244 B2 * | 5/2016 | Lu | ........................... | E05B 19/00 |

(Continued)

FOREIGN PATENT DOCUMENTS

| JP | 2011042989 A | 3/2011 |
|---|---|---|
| JP | 2016514774 A | 5/2016 |

(Continued)

*Primary Examiner* — Kyung S Lee
(74) *Attorney, Agent, or Firm* — RatnerPrestia

(57) ABSTRACT

A fob key for a vehicle. The fob key for a vehicle includes a housing accommodating a printed circuit board mounted with touch switches and electrical parts, buttons arranged on the housing and able to move toward touch switches, and a button-supporting structure elastically supporting buttons in a direction far away from touch switches.

8 Claims, 6 Drawing Sheets

(56) References Cited

U.S. PATENT DOCUMENTS

| | | | |
|---|---|---|---|
| 2006/0196759 A1* | 9/2006 | Soumi | H01H 13/705 200/341 |
| 2010/0220451 A1 | 9/2010 | Zaitz et al. | |
| 2012/0039052 A1* | 2/2012 | Valles Rangel | G05G 1/02 361/752 |
| 2013/0342307 A1 | 12/2013 | Auberger et al. | |
| 2014/0305250 A1 | 10/2014 | Jurek | |
| 2016/0071346 A1 | 3/2016 | Kaiser et al. | |
| 2018/0080249 A1 | 3/2018 | Watanabe | |

FOREIGN PATENT DOCUMENTS

| | | |
|---|---|---|
| JP | 2016188511 A | 11/2016 |
| KR | 200447288 Y1 | 1/2010 |
| KR | 20160004173 U | 12/2016 |
| KR | 20170000354 U | 1/2017 |
| KR | 101796614 B1 | 11/2017 |

\* cited by examiner

STRUCTURE OF A FOB KEY FOR INCREASING THE OPERATING FORCE OF A BUTTON

CROSS REFERENCE TO RELATED APPLICATIONS

This application claims priority to Korean Patent Application No. 10-2018-0076926, filed Jul. 3, 2018, the contents of such application being incorporated by reference herein.

FIELD OF THE INVENTION

The present invention relates to a fob key for a vehicle. In particular, a button-supporting structure supporting buttons is arranged between the buttons and the touch switches to increase the operating force on a button when the corresponding touch switch is pressed down and avoid noise when the button moves.

BACKGROUND OF THE INVENTION

Currently, a fob key is widely used to unlock or lock vehicle doors and start a vehicle engine.

As shown in FIG. 1 and FIG. 2, for a traditional fob key 1, a printed circuit board 50 mounted with touch switches 30 and electrical parts 40 is arranged in the housing 10, buttons 20 used to start touch switches 30 are arranged on the housing 10, and a rubber keypad 60 fastening the inner side of the buttons 20 is arranged between the touch switches 30 and the buttons 20 to avoid noise from being produced when a button 20 moves.

When a touch switch 30 is pressed down, the operating force on a button 20 can be adjusted through the operating force (3 N to 5 N) on the touch switch 30 and the hardness of the keypad 60.

However, the increase of the operating force on a button 20 through the adjustment of the operating force on the corresponding touch switch 30 and the adjustment of the hardness of the keypad 60 is limited. Owning to the structural limitation, it is impossible to avoid noise from being produced when the button 20 moves.

In addition, the traditional structure cannot satisfy the requirement for the recently desired operating force (13 N) on a button 20.

The background art of the present invention is described in Korean Laid-Open Utility Model Gazette No. 2016-0004173, incorporated herein by reference, (published on Dec. 7, 2016, title of the utility model: Fob key assembly for a vehicle).

SUMMARY OF THE INVENTION

An aspect of the present invention is presented to solve the above-mentioned problem. An aspect of the present invention is a fob key for a vehicle. Through the arrangement of a button-supporting structure supporting buttons between the buttons and the touch switches, the operating force on a button is increased when the corresponding touch switch is pressed down and noise can be avoided when the button moves.

A fob key for a vehicle according to an aspect of the present invention includes: a housing accommodating a printed circuit board mounted with touch switches and electrical parts, buttons arranged on the housing and able to move toward touch switches, and a button-supporting structure elastically supporting buttons in a direction far away from touch switches.

Further, an aspect of the present invention is characterized in that a button comprises the following structures: a body portion an operating force is exerted on and a rod portion protruding from the body portion toward a touch switch to transfer the operating force to the touch switch.

Further, an aspect of the present invention is characterized in that the button-supporting structure elastically supports the body portion of the button and is supported by the support block formed on the housing.

Further, an aspect of the present invention is characterized in that through-holes are formed in the support block and the rod portions of buttons pass through the through-holes.

Further, an aspect of the present invention is characterized in that said button-supporting structure is a coil spring whose size is large enough that it allows the rod portion of a button to pass through.

Further, an aspect of the present invention is characterized in that said button-supporting structure includes a base plate, which is sheet plate supported by said support block, and elastic support pieces aslant protruding from said base plate to elastically support said body portions of said buttons.

Further, an aspect of the present invention is characterized in that guide slots are formed in said base plate to constitute channels allowing said rod portions of said buttons to move in.

Further, an aspect of the present invention is characterized in that said body portion of said button is supported by a pair of said aslant elastic support pieces, and said elastic support pieces approach each other as they approach said body portion.

Further, an aspect of the present invention is characterized in that a contact plate is formed at the end of said pair of elastic support pieces to increase the area of contact with said body portion of said button.

For the fob key for a vehicle in an aspect of the present invention, a button-supporting structure supporting buttons is arranged between the buttons and the touch switches to increase the operating force on a button when the corresponding touch switch is pressed down and avoid noise when the button moves.

DETAILED DESCRIPTION OF THE PREFERRED EMBODIMENTS

Figure 1:
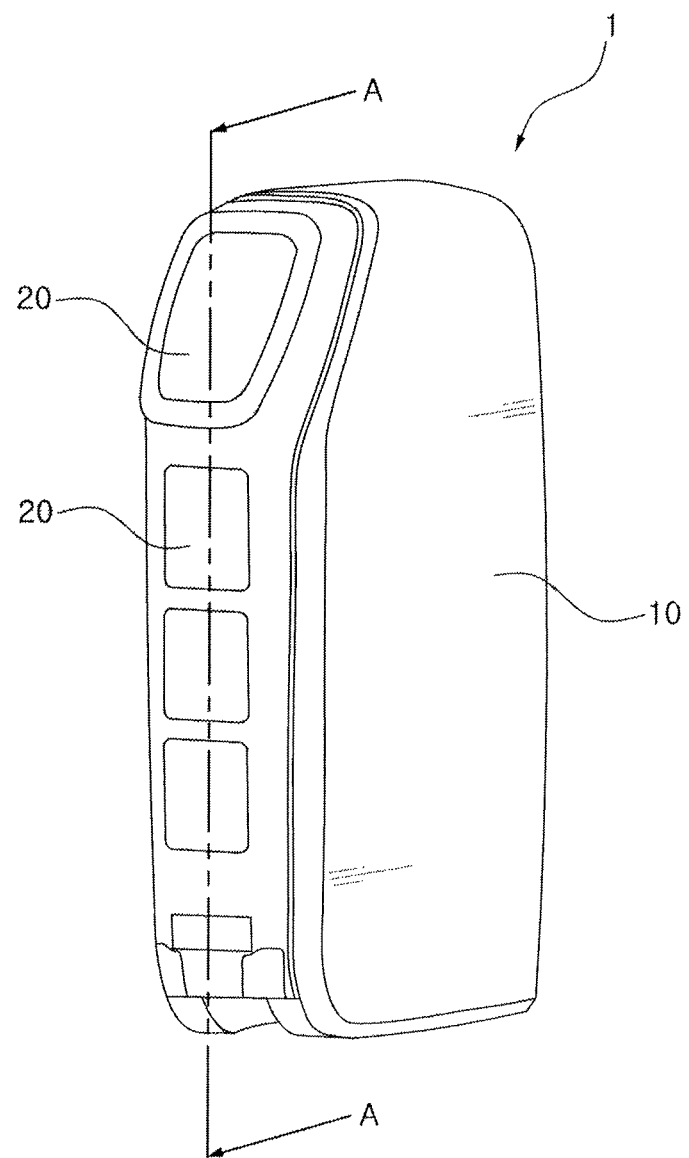
FIG. 1 is a schematic diagram of a traditional fob key for a vehicle.
Figure 2:
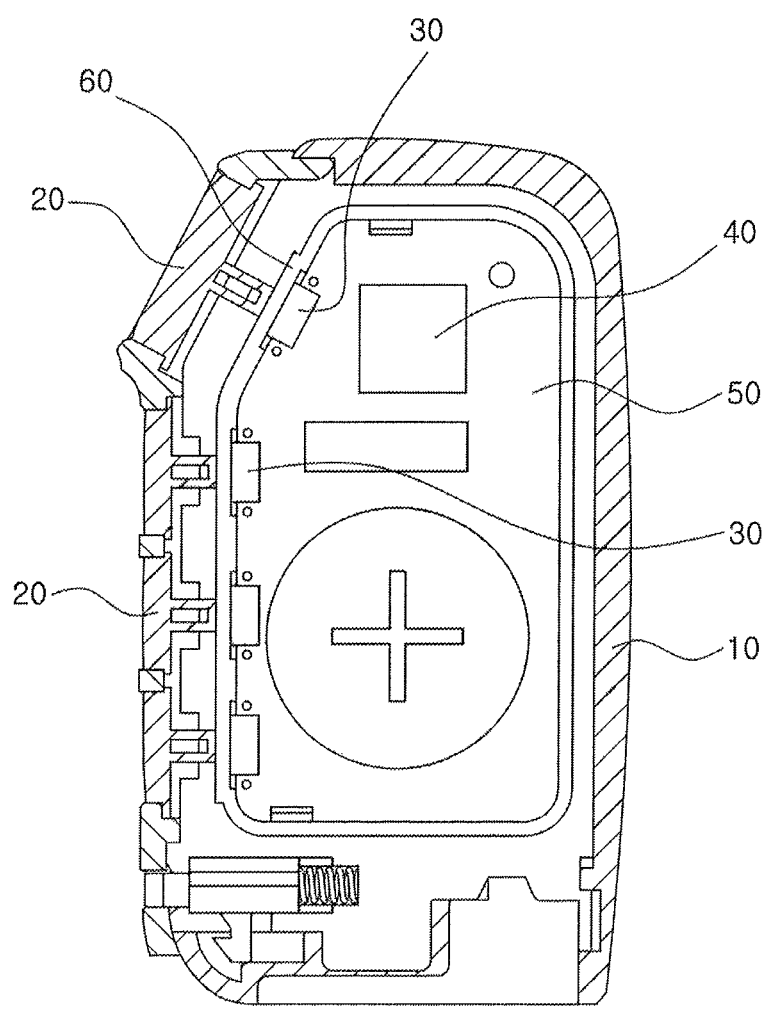
FIG. 2 is a cross-sectional view of A-A of FIG. 1.

Hereinafter, an embodiment of a fob key for a vehicle according to an aspect of the present invention will be described with reference to the accompanying drawings. In this process, the thickness of lines or the size of the components shown in the drawings may be exaggerated for the clarity and ease of understanding of the description. In addition, the following terms are defined in consideration of the functions of an aspect of the present invention, which may vary depending on the intention or practice of a user or an operator. Therefore, the definitions of these terms should be based on the content throughout this specification.

Figure 3:
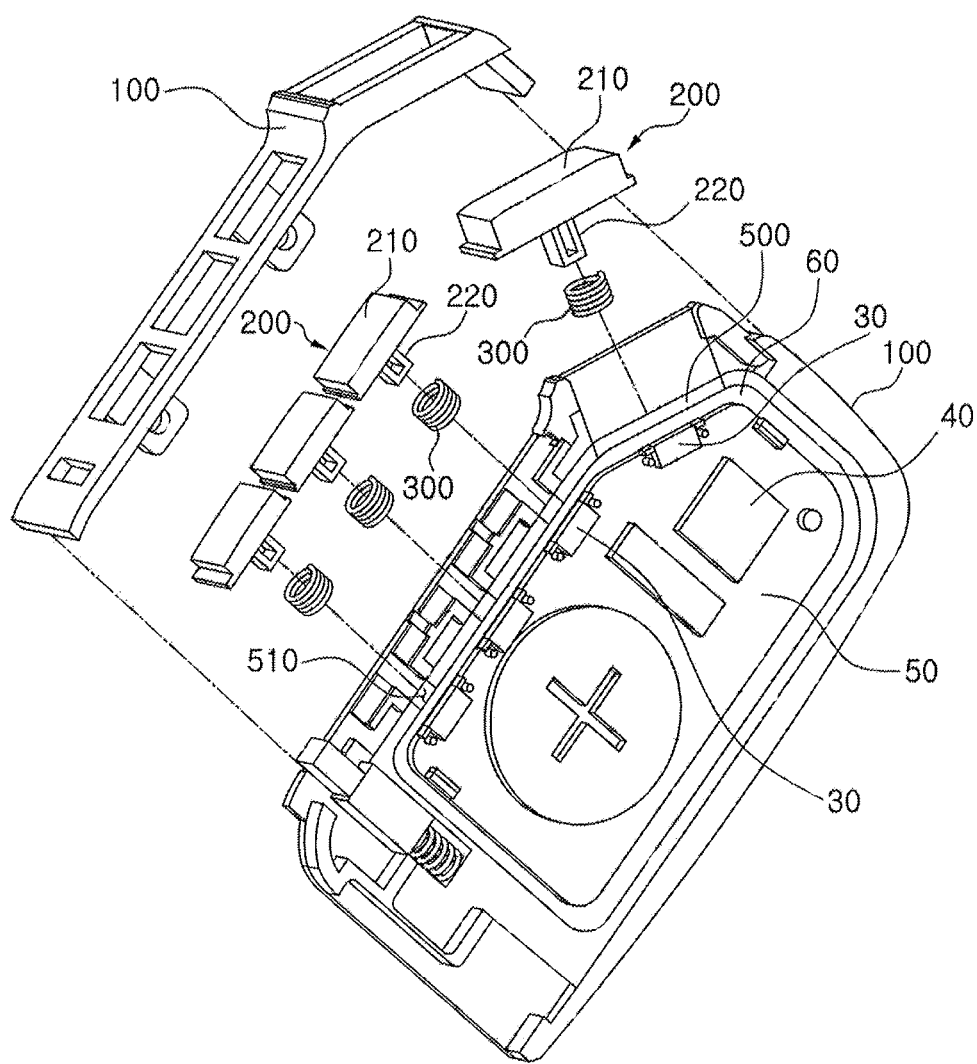
FIG. 3 is an exploded oblique view of the fob key for a vehicle in one embodiment of an aspect of the present invention and is applicable to the first embodiment of the button-supporting structure.
Figure 4:
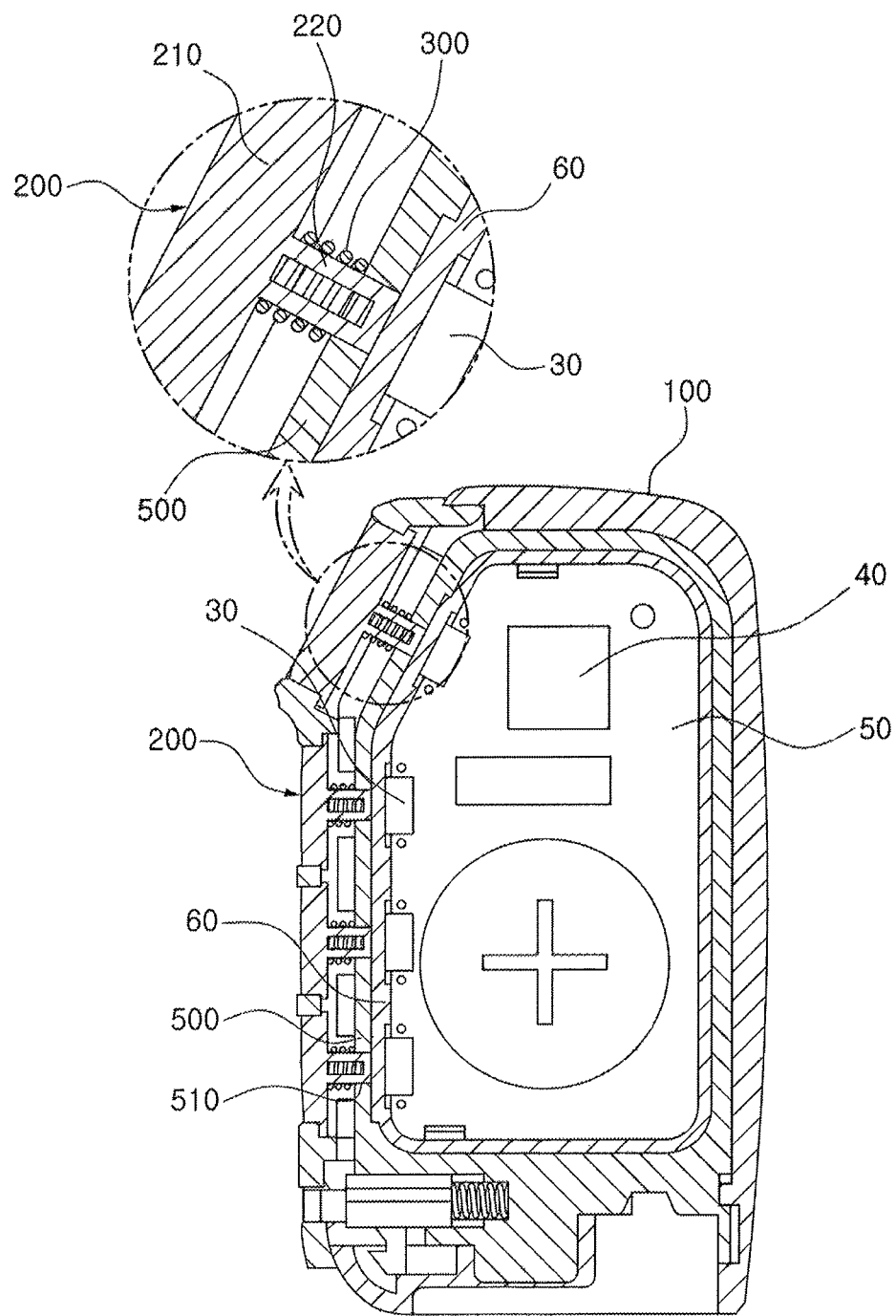
FIG. 4 is a cross-sectional view of the fob key for a vehicle in one embodiment of an aspect of the present invention and is applicable to the first embodiment of the button-supporting structure.
Figure 5:
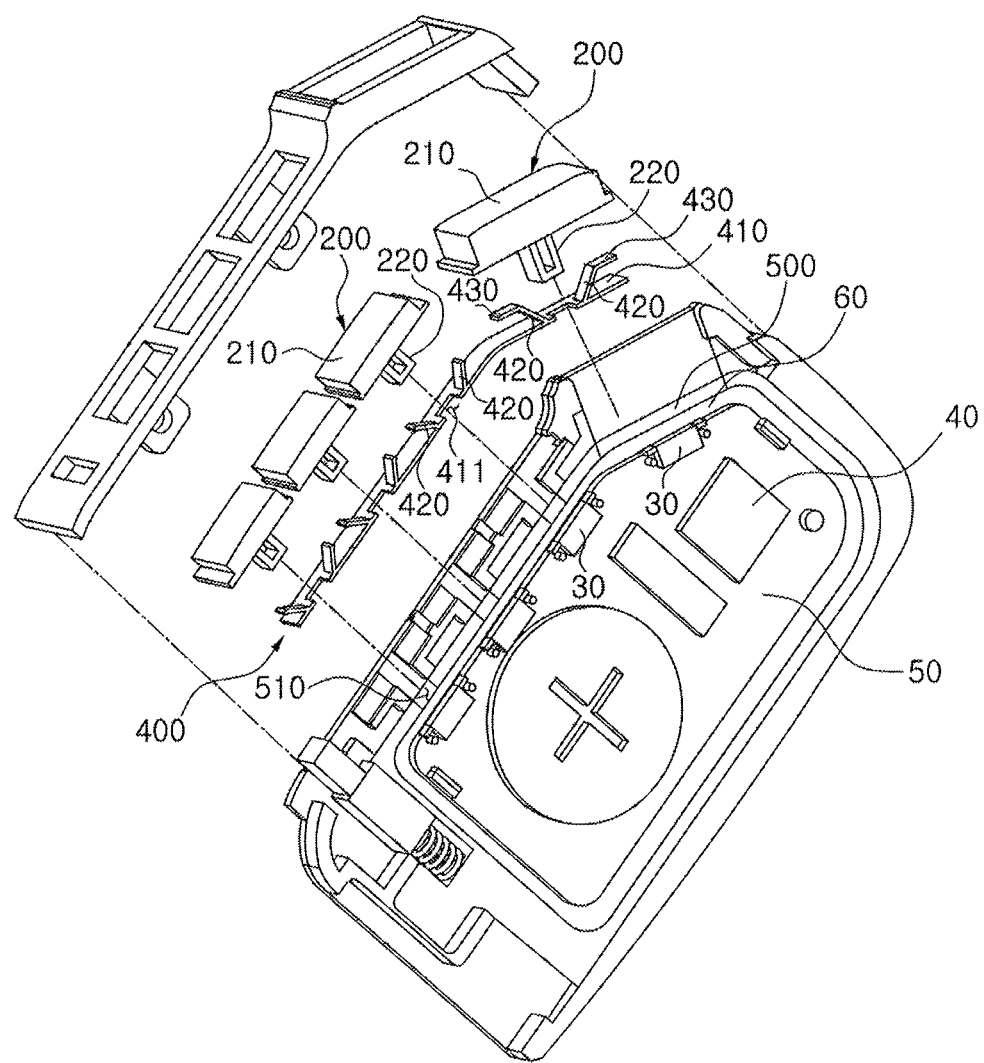
FIG. 5 is an exploded oblique view of the fob key for a vehicle in another embodiment of an aspect of the present invention and is applicable to the second embodiment of the button-supporting structure.
Figure 6:
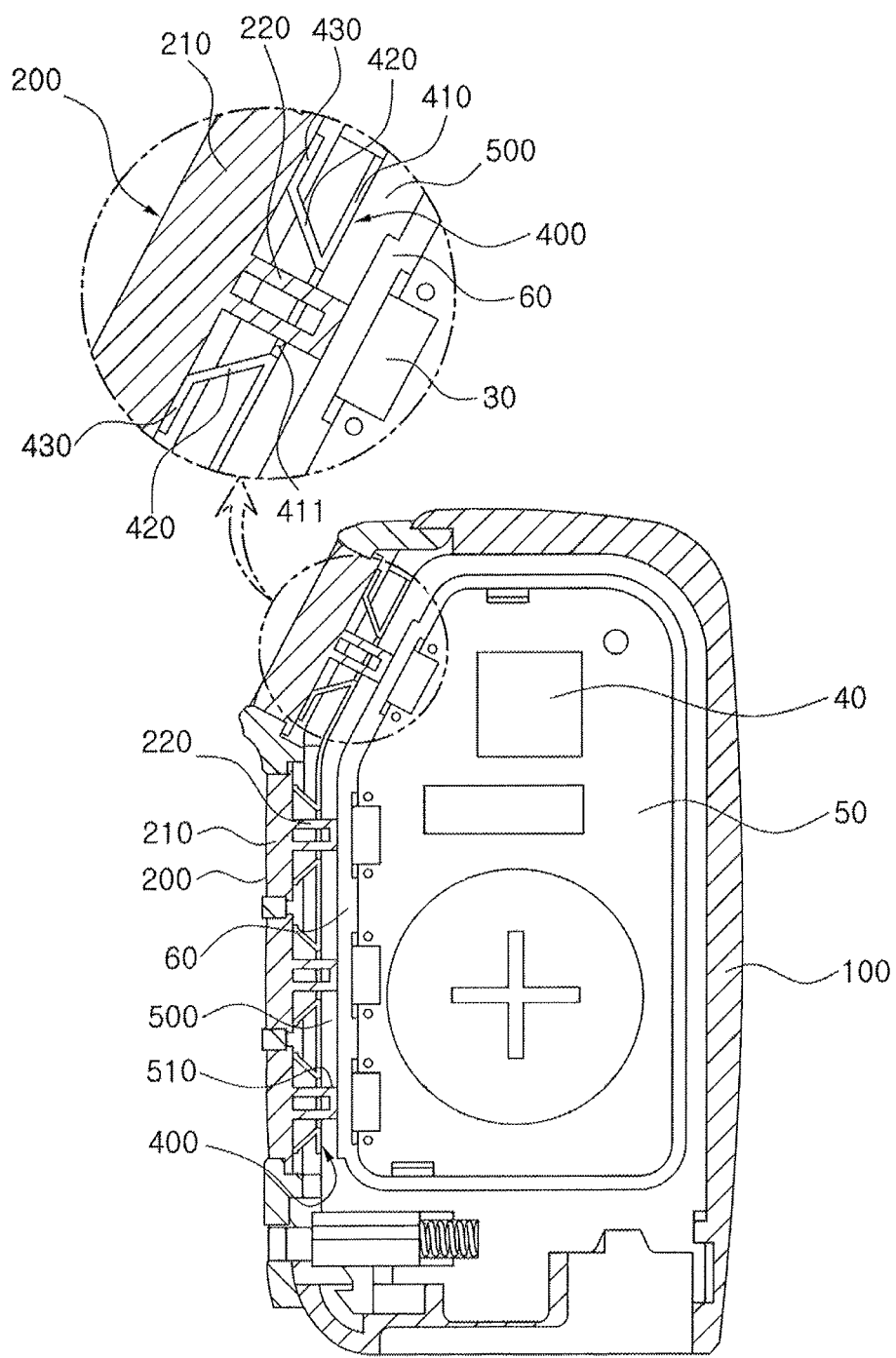
FIG. 6 is a cross-sectional view of the fob key for a vehicle in another embodiment of an aspect of the present invention and is applicable to the second embodiment of the button-supporting structure.

FIG. 3 is an exploded oblique view of the fob key for a vehicle in one embodiment of an aspect of the present invention and is applicable to the first embodiment of the button-supporting structure; FIG. 4 is a cross-sectional view of the fob key for a vehicle in one embodiment of an aspect of the present invention and is applicable to the first embodiment of the button-supporting structure; FIG. 5 is an exploded oblique view of the fob key for a vehicle in another embodiment of an aspect of the present invention and is applicable to the second embodiment of the button-supporting structure; FIG. 6 is a cross-sectional view of the fob key for a vehicle in another embodiment of an aspect of the present invention and is applicable to the second embodiment of the button-supporting structure.

As shown in FIG. 3 through FIG. 6, the fob key for a vehicle in an aspect of the present invention includes a housing 100 accommodating a printed circuit board 50 mounted with touch switches 30 and electrical parts 40, buttons 200 arranged on the housing and able to move toward touch switches 30, and a button-supporting structure elastically supporting buttons 200 in a direction far away from touch switches 30.

The button 200 includes a body portion 210 an operating force is exerted on, and a rod portion 220 protruding from the body portion 210 toward a touch switch 30 to transfer the operating force to the touch switch 30.

The button-supporting structure elastically supports the body portions 210 of the buttons 200. Further, said button-supporting structure is supported by the support block 500 formed on the housing 100. Through-holes 510 are formed in the support block 500 and the rod portions 220 of the buttons 200 pass through the through-holes.

As shown in FIG. 3 and FIG. 4, the first embodiment of the button-supporting structure 300 is a coil spring whose size is large enough that it allows the rod portions 220 of the buttons 200 to pass through.

Further, as shown in FIG. 5 and FIG. 6, the second embodiment of the button-supporting structure 400 includes a base plate 410, which is a sheet plate supported by the support block 500, and elastic support pieces 420 protruding aslant from the base plate 410 to elastically support the body portions 210 of the buttons 200.

Guide slots 411 are formed in the base plate 410 to constitute channels allowing the rod portions 220 of the buttons 200 to move in.

The body portion 210 of a button 200 is supported by a pair of aslant elastic support pieces 420, and the elastic support pieces 420 approach each other as they approach the body portion 210 of the button 200.

As described above, a pair of elastic support pieces 420 incline oppositely and elastically support the body portion 210 of a button 200, and the elastic force of the elastic support pieces 420 can uniformly be maintained even if a button 200 is repeatedly operated.

A contact plate 430 is formed at the end of a pair of elastic support pieces 420 to increase the area of contact with the body portion 210 of a button 200.

Even if the body portion 210 of a button 200 is large, the movement of the button 200 can effectively be prevented because the contact plate 430 increases the area of contact with the body portion 210 of the button 200.

For the fob key for a vehicle in one embodiment of the present invention, a button-supporting structure supporting buttons 200 is arranged between the buttons 200 and the touch switches 30 to avoid noise from being produced when a button 200 moves.

Further, the operating force on a button 200 can be increased when the corresponding touch switch 30 is pressed down, the requirement for the recently desired operating force (13 N) on the button 200 can be satisfied, the operating force on the button 200 can easily be increased, and the operating force on the button 200 can be adjusted to various magnitudes.

As described above, according to an aspect of the present invention, a button-supporting structure supporting buttons is arranged between the buttons and the touch switches, and thus the operating force on a button is increased when the corresponding touch switch is pressed down and noise can be avoided when the button moves.

Although aspects of the present invention have been described with reference to the embodiments illustrated in the drawings, this is merely exemplary. It will be understood by those skilled in the art that various modifications and embodiments equivalent thereto may be implemented. Accordingly, the true technical protection scope of the present invention should be determined by the following claims.

DESCRIPTION OF THE REFERENCE NUMERALS OR SYMBOLS

| | |
|---|---|
| 30: Touch switch | 40: Electrical parts |
| 50: Printed circuit board | 100: Housing |
| 200: Button | 210: Body portion |
| 220: Rod portion | 300: Button-supporting structure |
| 400: Button-supporting structure | 410: Base plate |
| 420: Elastic support piece | 430: Contact plate |
| 500: Support block | 510: Through-hole |

The invention claimed is:

1. A fob key for a vehicle, comprising:
    a housing accommodating a printed circuit board mounted with touch switches and electrical parts,
    buttons arranged on the housing and able to move toward the touch switches, and
    a button-supporting structure elastically supporting the buttons in a direction far away from the touch switches,
    wherein said button includes the following structures:
        a body portion on which an operating force is exerted, and
        a rod portion protruding from the body portion toward a touch switch to transfer the operating force to the touch switch
    wherein said button-supporting structure elastically supports the body portion of said button and said button-supporting structure is supported by a support block formed on said housing, and
    wherein said button-supporting structure includes:

a base plate, which is a sheet plate supported by said support block, and elastic support pieces protruding aslant from said base plate to elastically support said body portions of said buttons.

2. The fob key for a vehicle as claimed in claim 1, wherein said button-supporting structure is a coil spring whose size is large enough that it allows said rod portion of said button to pass through.

3. The fob key for a vehicle as claimed in claim 1, wherein guide slots are formed in said base plate to constitute channels allowing said rod portions of said buttons to move in.

4. The fob key for a vehicle as claimed in claim 1, wherein said body portion of said button is supported by a pair of said aslant elastic support pieces, and said elastic support pieces approach each other as they approach said body portion.

5. The fob key for a vehicle as claimed in claim 4, wherein a contact plate is formed at the end of said pair of elastic support pieces to increase the area of contact with said body portion of said button.

6. The fob key for a vehicle as claimed in claim 1, wherein said button-supporting structure is a coil spring whose size is large enough that it allows said rod portion of said button to pass through.

7. A fob key for a vehicle comprising:
 a housing accommodating a printed circuit board mounted with touch switches and electrical parts,
 buttons arranged on the housing and able to move toward the touch switches, and
 a button-supporting structure elastically supporting the buttons in a direction far away from the touch switches,
 wherein said button includes the following structures:
  a body portion on which an operating force is exerted, and
  a rod portion protruding from the body portion toward a touch switch to transfer the operating force to the touch switch,
 wherein said button-supporting structure elastically supports the body portion of said button and said button-supporting structure is supported by a support block formed on said housing,
 wherein through-holes are formed in said support block and said rod portions of said buttons pass through the through-holes, and
 wherein said button-supporting structure includes:
  a base plate, which is a sheet plate supported by said support block, and
  elastic support pieces protruding aslant from said base plate to elastically support said body portions of said buttons.

8. The fob key for a vehicle as claimed in claim 7, wherein said button-supporting structure is a coil spring whose size is large enough that it allows said rod portion of said button to pass through.

\* \* \* \* \*